(12) United States Patent
McLaughlin et al.

(10) Patent No.: US 7,394,154 B2
(45) Date of Patent: Jul. 1, 2008

(54) EMBEDDED BARRIER FOR DIELECTRIC ENCAPSULATION

(75) Inventors: Paul S. McLaughlin, Poughkeepsie, NY (US); Sujatha Sankaran, Wappingers Falls, NY (US); Theodorus E. Standaert, Pine Bush, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/162,513

(22) Filed: Sep. 13, 2005

(65) Prior Publication Data

US 2007/0057374 A1    Mar. 15, 2007

(51) Int. Cl.
*H01L 23/52* (2006.01)
(52) U.S. Cl. .................. 257/751; 257/E23.152
(58) Field of Classification Search ............ 257/751, 257/752, 753, 758, 767, 774, E23.145, E23.151
See application file for complete search history.

(56) References Cited

U.S. PATENT DOCUMENTS

| | | | |
|---|---|---|---|
| 5,850,102 A * | 12/1998 | Matsuno .................. 257/635 |
| 6,184,153 B1 | 2/2001 | Rasmussen et al. |
| 6,268,283 B1 | 7/2001 | Huang |
| 6,531,777 B1 * | 3/2003 | Woo et al. .................. 257/752 |
| 6,605,540 B2 | 8/2003 | Ali et al. |
| 6,669,858 B2 | 12/2003 | Bjorkman et al. |
| 6,686,271 B2 | 2/2004 | Raaijmakers et al. |
| 6,699,783 B2 | 3/2004 | Raaijmakers et al. |
| 6,759,325 B2 | 7/2004 | Raaijmakers et al. |
| 6,969,911 B2 * | 11/2005 | Abe .................. 257/751 |
| 2001/0000115 A1 * | 4/2001 | Greco et al. .................. 257/773 |
| 2002/0050648 A1 * | 5/2002 | Kishida et al. .................. 257/763 |
| 2002/0102787 A1 | 8/2002 | Coolbaugh et al. |
| 2003/0183940 A1 * | 10/2003 | Noguchi et al. .................. 257/767 |
| 2004/0094839 A1 * | 5/2004 | Fitzsimmons et al. .................. 257/758 |
| 2004/0185668 A1 * | 9/2004 | Morita et al. .................. 438/692 |
| 2005/0110145 A1 * | 5/2005 | Elers .................. 257/758 |
| 2005/0184397 A1 * | 8/2005 | Gates et al. .................. 257/774 |
| 2006/0012014 A1 * | 1/2006 | Chen et al. .................. 257/635 |

* cited by examiner

*Primary Examiner*—Evan Pert
*Assistant Examiner*—Ben P Sandvik
(74) *Attorney, Agent, or Firm*—Joseph Petrokaitis

(57) ABSTRACT

A semiconductor interconnect structure and method providing an embedded barrier layer to prevent damage to the dielectric material during or after Chemical Mechanical Polishing. The method employs a combination of an embedded film, etchback, using either selective CoWP or a conformal cap such as a SiCNH film, to protect the dielectric material from the CMP process as well as subsequent etch, clean and deposition steps of the next interconnect level.

5 Claims, 6 Drawing Sheets

EMBEDDED BARRIER FOR DIELECTRIC ENCAPSULATION

BACKGROUND OF THE INVENTION

The present invention relates to the fabrication of integrated circuits, and more particularly, to the deposition and etching of dielectric layers on a substrate as well as planarization of damascene interconnects.

As device dimensions continue to shrink it becomes more challenging to prevent the interconnect delay from limiting the overall chip performance. One solution is to introduce new dielectric materials with a lower dielectric constant. Ultra Low K (ULK) dielectrics have a dielectric constant of about 2.5 or less and offer a significant advantage by lowering the capacitive coupling between interconnects and in turn lowering the interconnect delay. The integration of ULK dielectrics, however, presents numerous challenges and incompatibility of ULK dielectrics with Chemical Mechanical Polishing (CMP) is one example.

The retention of the hardmask layer is therefore becoming an important constraint for the integration of some ULK dielectrics. It assures that the ULK dielectric remains intact and free of defects without modification of the dielectric constant. To maintain sufficient hardmask coverage in all areas the hardmask layer will need to be relatively thick. Since a typical hardmask has a dielectric constant of 3.0 or more, a thicker hardmask adversely affects keff and Ctotal. (Ctotal is the capacitance of an interconnect and includes the capacitive coupling to all its neighboring interconnects. Keff is the dielectric of a single medium that would yield the same Ctotal if it were to replace all the dielectric films between the interconnects.) The hardmask can also serve the purpose of etch stop during the via etch of subsequent levels thereby ensuring that exposed interlevel dielectric (ILD), in the case of misaligned vias, is not affected.

Current problems in the art include the loss of hardmask due to CMP in areas that have a high metal to dielectric ratio, typically 85%, and hardmask retention problems in areas with underlying topography. Increased hardmask thickness requirements due to CMP selectivity of these features lead to overall higher line to line capacitance. Another problem is inability to retain hardmask leads to ULK damage, causing reliability failures such as Cu nodule accumulation, Cu corrosion and low voltage breakdown due to poor adhesion and voids.

The present invention describes a new integration scheme which relies on a thin embedded barrier to prevent exposure of ULK material during or after CMP. The thin embedded film serves both purposes of the hardmask without being susceptible to CMP related hardmask retention issues. The layer is thin enough to protect the ULK during CMP and subsequent via etch without adversely affecting the keff and Ctotal. The invention also provides a novel structure. The invention uses a combination of an embedded film, etchback, using either selective CoWP or a conformal cap such as a SiCNH film, to ensure that the ULK material is never exposed to the CMP process or to the via etch, clean and liner deposition of the next interconnect level.

These and other purposes of the present invention will become more apparent after referring to the following description in conjunction with the accompanying drawings.

BRIEF SUMMARY OF THE INVENTION

The first aspect of the invention is directed to an electronic device, comprising a first diffusion barrier layer; a first dielectric layer on the fist diffusion barrier layer; a hardmask layer on portions of the first dielectric layer; a liner layer on portions of the first dielectric layer; a metal layer on the liner layer; a second diffusion barrier layer contiguous with the hardmask layer and the metal layer, and a second dielectric layer on the second diffusion barrier layer.

The second diffusion barrier layer is preferably an SiCNH layer. The hardmask layer is preferably a dense SiCOH film. The first and second dielectric layers are preferably ULK dielectrics. The metal layer is preferably a copper layer.

Another aspect of the invention is directed to an electronic device, comprising a first diffusion barrier layer; a first dielectric layer on the first diffusion barrier layer; a hardmask layer on portions of the first dielectric layer; a liner layer on portions of the first dielectric layer; a metal layer on the liner layer; a second diffusion barrier layer on the metal layer, and a second dielectric layer on the hardmask layer and the second diffusion barrier layer.

The second diffusion barrier layer is preferably a CoWP layer. The hardmask layer is preferably a dense SiCOH layer. The first and second dielectric layers are preferably ULK dielectrics. The metal layer is preferably a copper layer.

Another aspect of the invention is directed to a method of making an electronic device comprising the steps of: providing a first diffusion barrier layer; providing a first dielectric layer on the first diffusion barrier layer; providing a hardmask layer on the first dielectric layer; providing an oxide layer on the hardmask layer; forming openings in the oxide, hardmask and first dielectric layers; providing a liner layer; providing a metal layer; removing a portion of the metal layer and the oxide layer; selectively etching the remaining portion of the oxide layer; forming a second diffusion barrier layer contiguously on the hardmask layer and the metal layer, and providing a second dielectric layer on the second diffusion barrier layer.

In a preferred embodiment the selective etch is a dilute HF etch or a selective dry plasma etch. In a preferred embodiment the metal layer and oxide layer removal is a CMP removal.

Another aspect of the invention is directed a method of making an electronic device comprising the steps of: providing a first diffusion barrier layer; providing a first dielectric layer on the first diffusion barrier layer; providing a hardmask layer on the first dielectric layer; providing an oxide layer on the hardmask layer; forming openings in the oxide, hardmask and first dielectric layers; providing a liner layer; providing a metal layer; removing a portion of the metal layer and the oxide layer; selectively etching the remaining portion of the oxide layer; forming a second diffusion barrier layer selectively on the metal layer, and providing a second dielectric layer on the second diffusion barrier layer and the hardmask layer.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

The purposes of the present invention have been achieved by providing an embedded barrier for improved dielectric encapsulation, and particularly for improved encapsulation for Ultra Low K (ULK) dielectrics.

The present invention discloses a method for retaining a thinner uniform single level hardmask using a non-CMP approach to encapsulate the dielectric. Disclosed methods include an etchback using dilute HF or selective dry plasma process. The present invention also discloses a structure having approximately 10% line to line capacitance improvement using a thinner and recessed hardmask less than 50 Angstroms.

Figure 1:
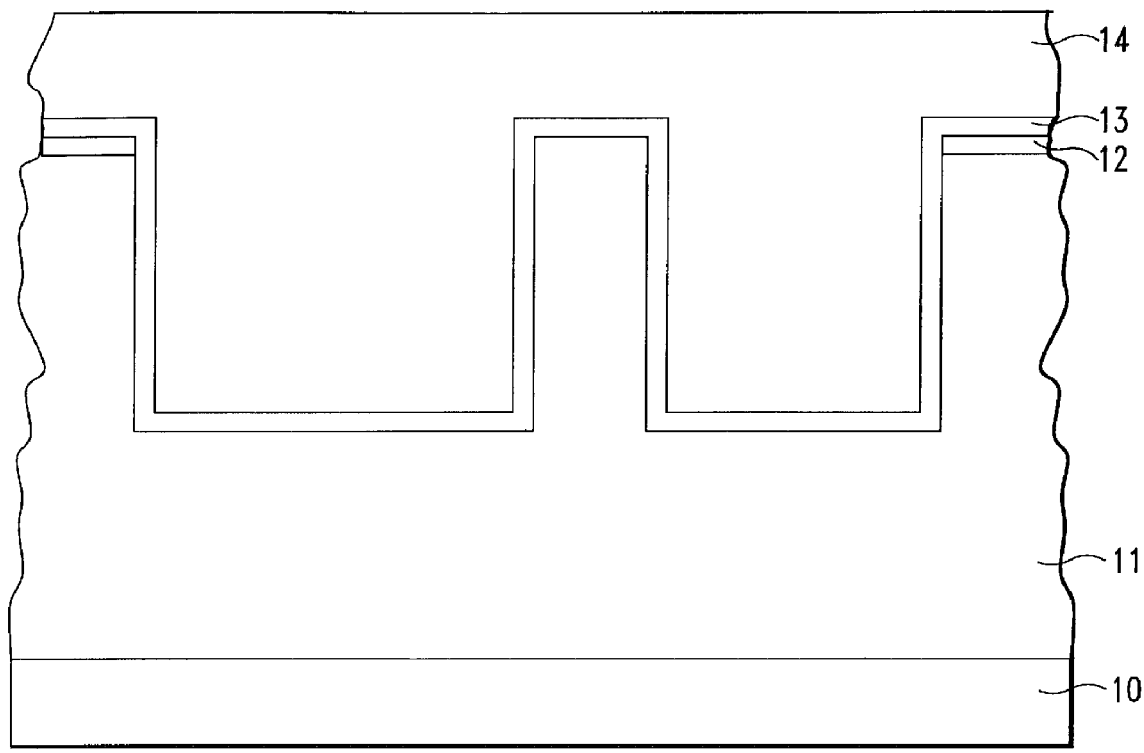
FIGS. 1-3 illustrate a conventional interconnect structure.

Referring to FIG. 1 there is illustrated a conventional patterning and metallization interconnect structure comprising a cap 10, ULK dielectric 11, hardmask 12, liner 13 and conductive metal 14 filling the patterned features in the ULK dielectric 11. The interconnects can be formed by depositing blanket films of the cap 10, ULK dielectric 11 and hardmask 12. Depending on other integration requirements, it may be necessary to have a multi-layer hardmask stack. Additional hardmask layers, however, do not limit the scope of the invention. By using lithography and Reactive Ion Etching (RIE) one can transfer photoresist images into the hardmask layer (or stack) and into the underlying dielectric films. This patterning can be either single or dual damascene.

The cap 10 is typically a copper diffusion barrier and etch stop layer such as a silicon nitride or a SiCNH layer. The ULK dielectric 11 may be a porous low K material such as porous silsesquioxane or porous SiLK. The hardmask 12 is typically a dense SiCOH material. The liner 13 is typically tantalum or tantalum nitride. The conductive metal 14 is typically plated copper. There would also typically be metal interconnect lines underneath cap 10 not shown connecting the various levels of the device.

Figure 2:
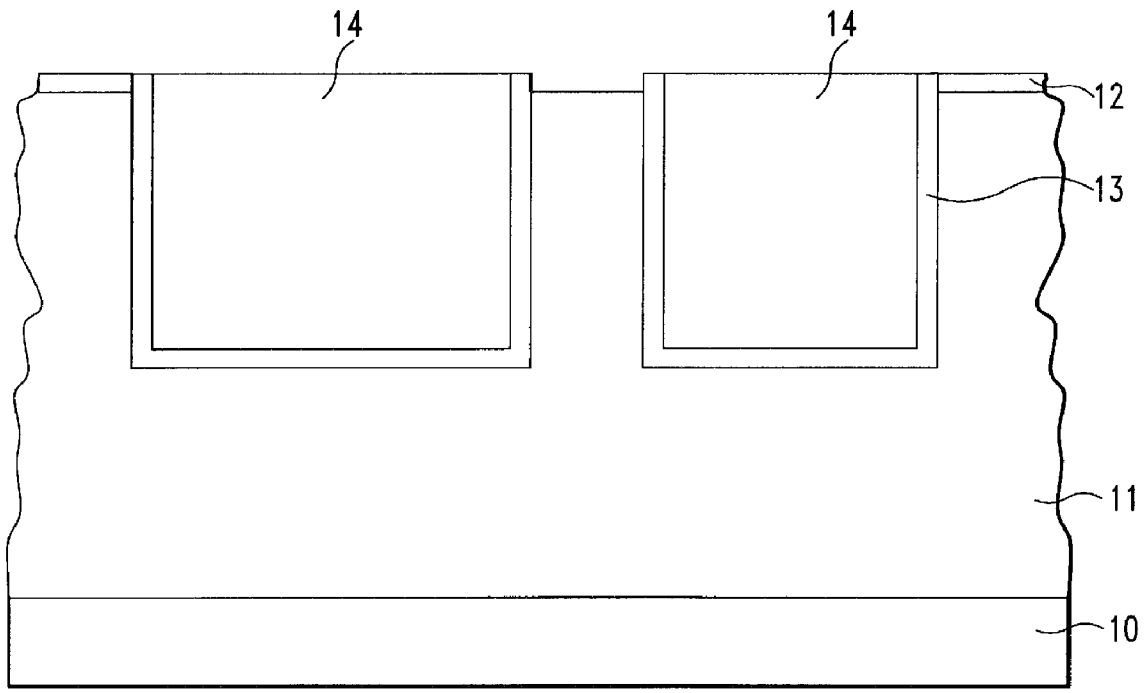

Referring to FIG. 2 the structure is shown after CMP to remove the excess metal 14 and liner material 13. The CMP should stop at the hardmask 12 but due to non-uniformity in the CMP process a portion of the hardmask 12 is often lost between features. This is a common problem in the art. High feature pattern density leads to a higher erosion rate. This leads to the undesired removal of the hardmask 12 in some areas. This is a problem because the ULK material 11 is now exposed in this area. In addition to CMP damage, the ULK material will be etched and damaged in subsequent processing. One solution to this problem is to simply increase the thickness of the hardmask 12 to assure complete coverage of the ULK material after CMP. The problem with this solution is that a thicker hardmask creates an undesirable increase in the line to line capacitance.

Figure 3:
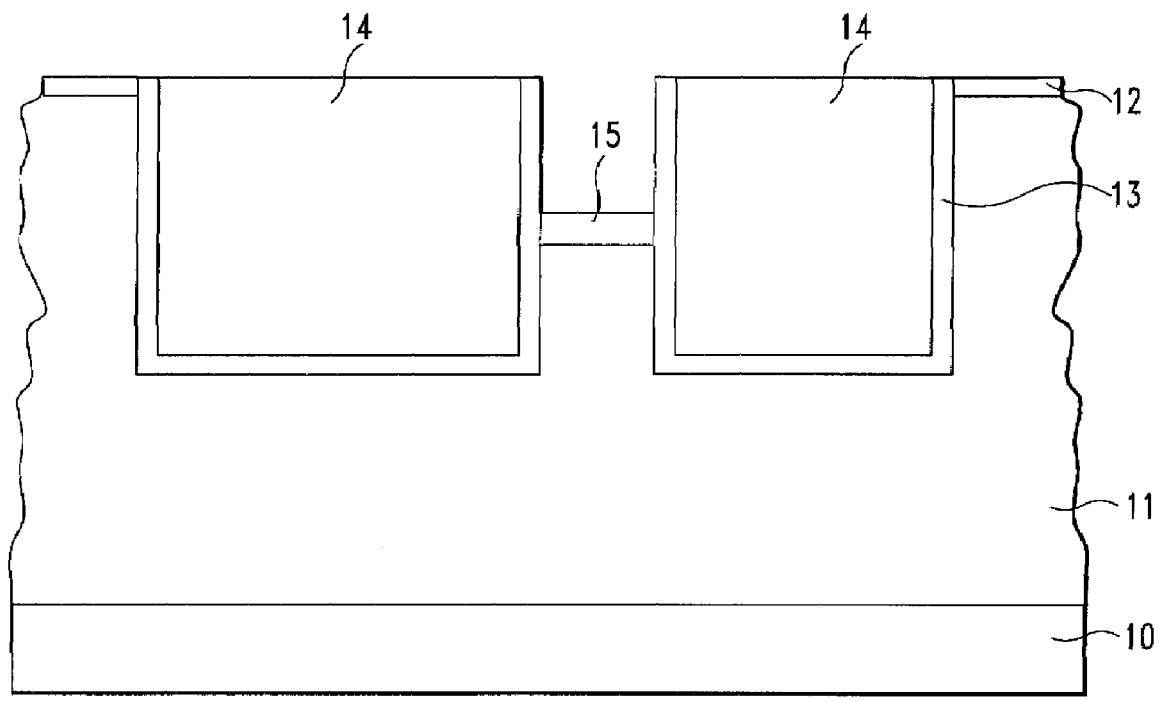

Referring to FIG. 3 there is illustrated this current problem in the art. The structure is shown after cleaning pretreatment prior to subsequent level deposition. This clean typically includes some type of etch for adhesion promotion, for example an exposure to hydrogen or nitrogen plasmas. There is shown a damaged portion 15 of the ULK material 11 due to the absence of the hardmask 12 in that region. This damaged portion 15 is now susceptible to accumulating moisture, increase in dielectric constant and ultimately corroding the copper lines. This copper corrosion will not only damage the line but also will allow copper oxide to form in the dielectric space. The copper oxide will lead to yield loss and potentially field fails.

Figure 4:
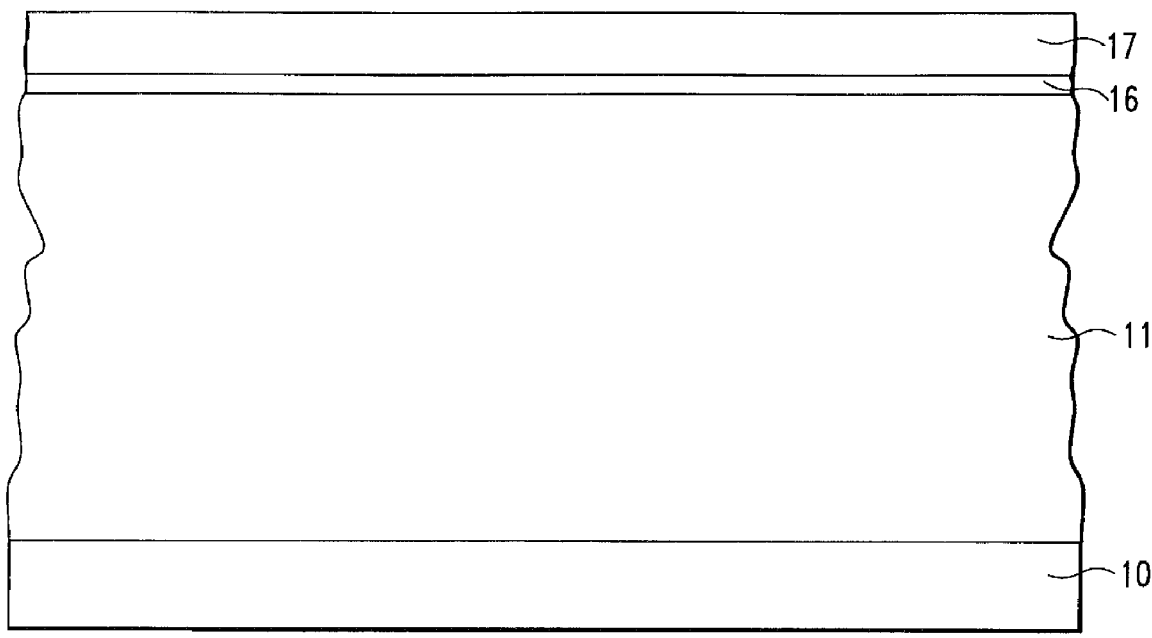
FIGS. 4-11 illustrate an interconnect structure according to the present invention.

The present invention is now illustrated by referring to FIG. 4. The structure comprises a cap 10, ULK material 11, hardmask 16 and oxide 17. In a preferred embodiment the hardmask 16 is a dense SiCOH film with a thickness in the range of approximately 120 Å. The oxide 17 has a preferred thickness in the range of approximately 750 Å.

Figure 5:
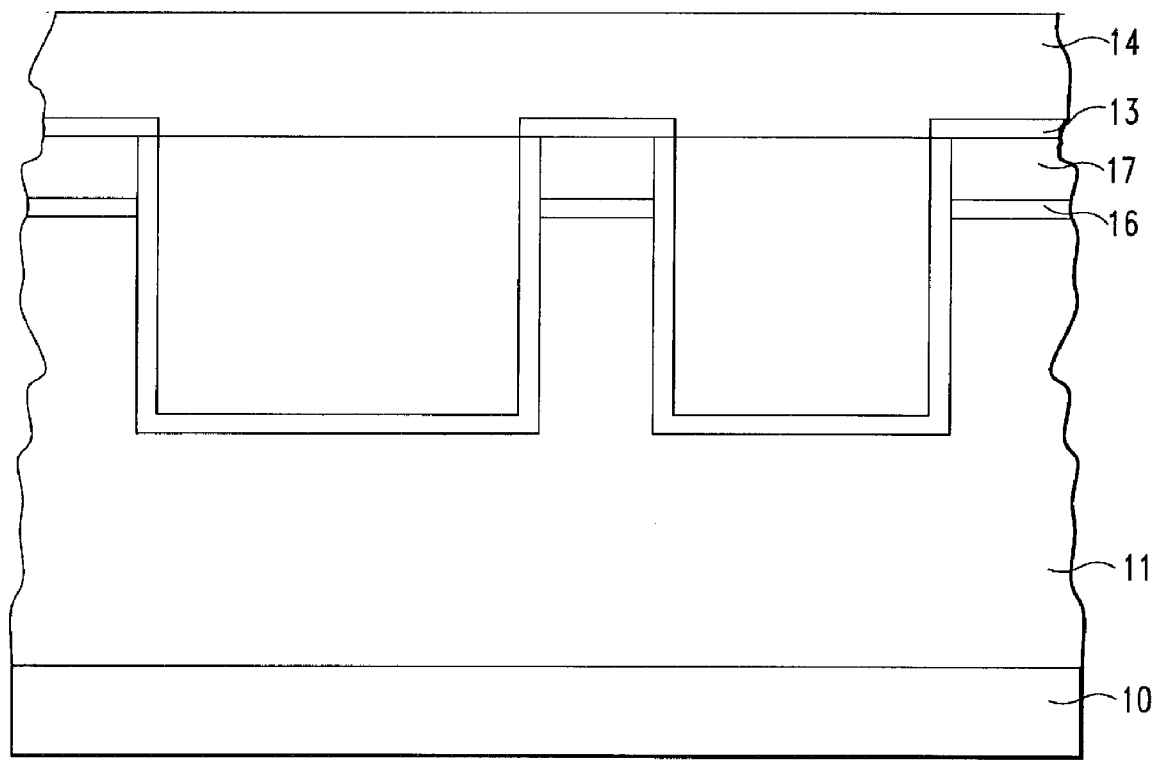

Referring now to FIG. 5 the structure is shown after conventional patterning and metallization. A liner 13 and conductive metal 14 is deposited in features patterned in the structure. In a preferred embodiment the liner 13 is tantalum or tantalum nitride and the conductive metal 14 is plated copper.

Figure 6:
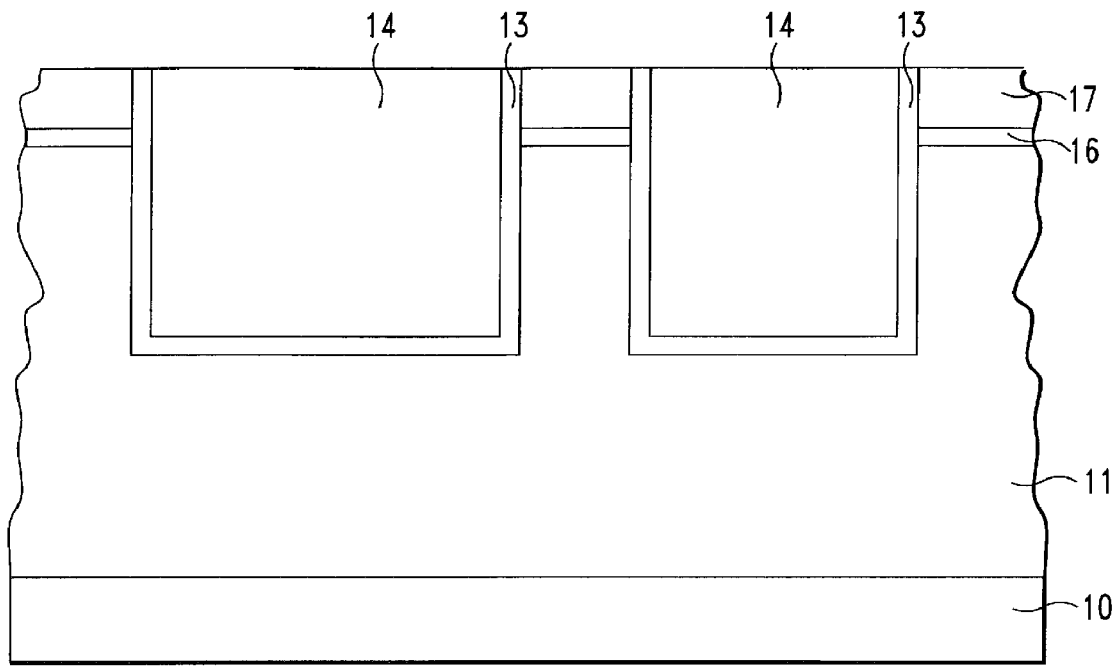
Figure 7:
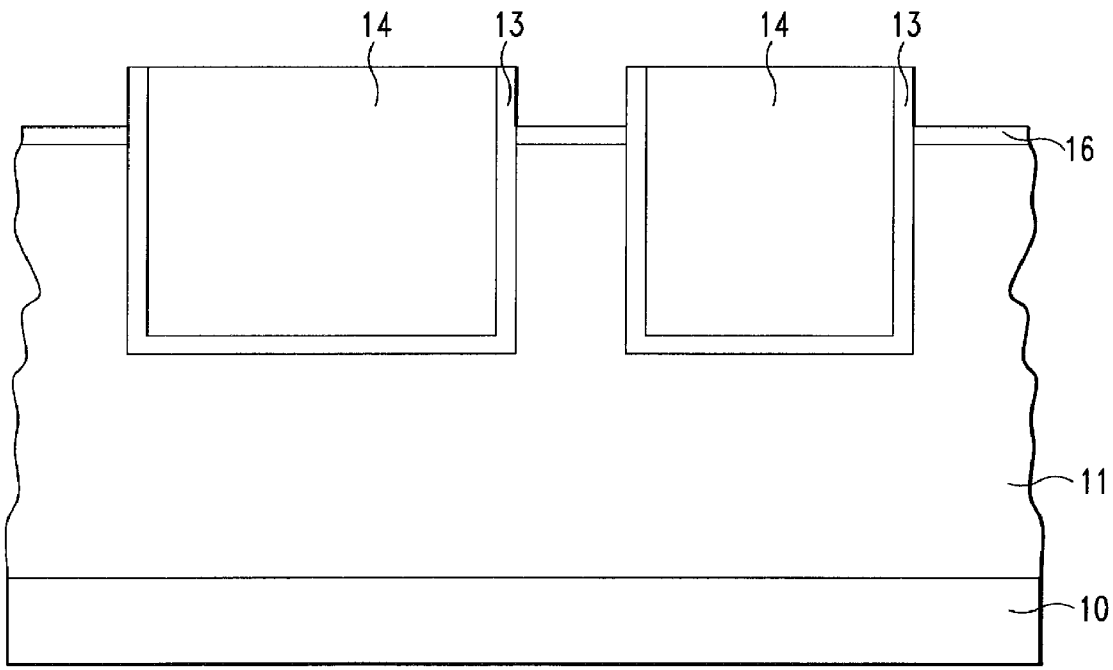

Referring to FIG. 6 the structure is shown after CMP. It can be seen that the ULK material 11 is still completely covered by the hardmask 16 and oxide 17. Referring to FIG. 7 the structure is shown following a selective etch back of the oxide 17. In a preferred embodiment the selective etch back is a wet etch using a dilute HF. A preferred wet etch would use a dilute HF solution in the range of approximately of 50:1 to approximately 100:1.

Figure 8:
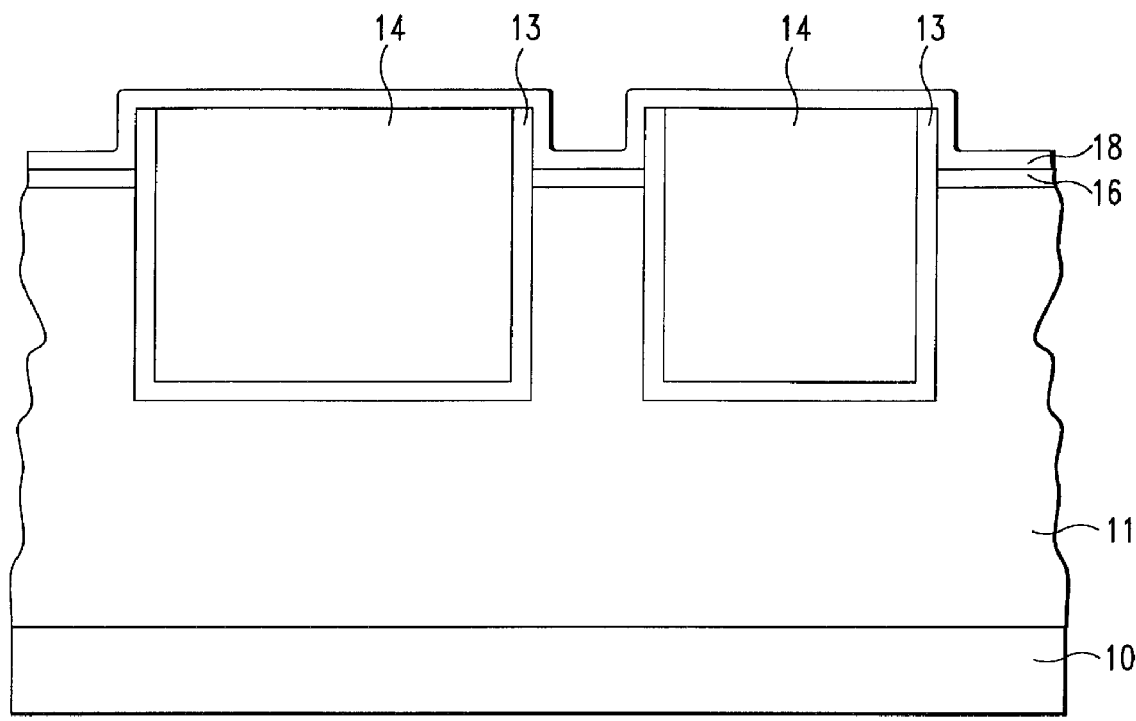
Figure 9:
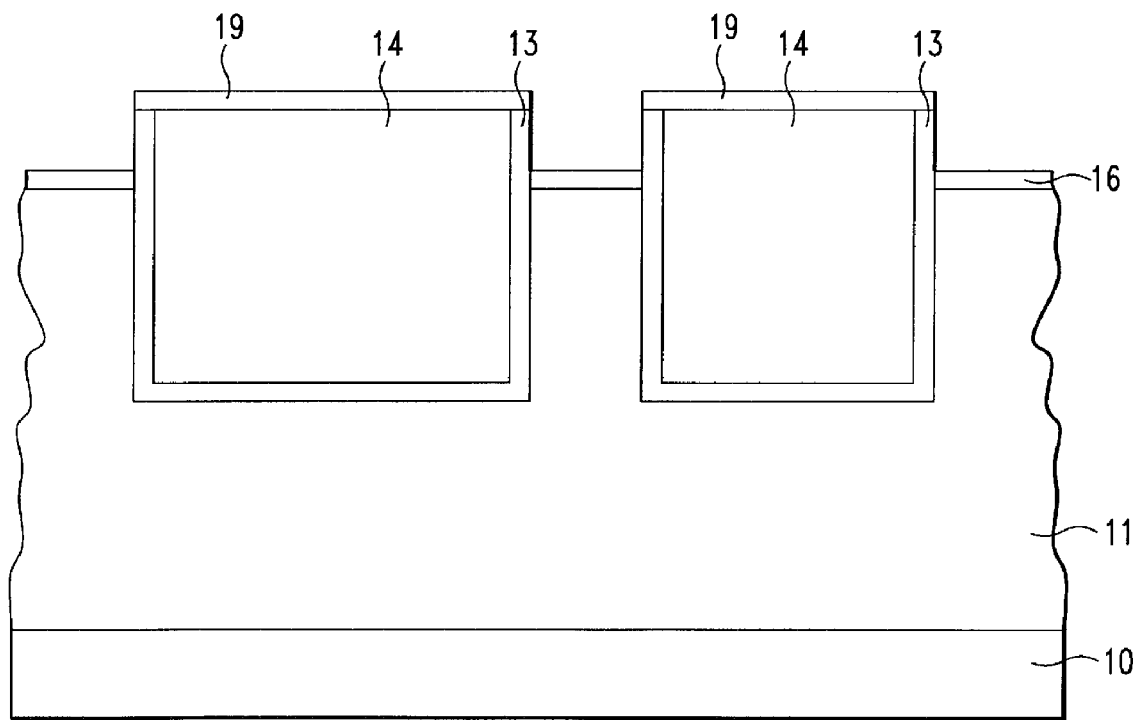
Figure 11:
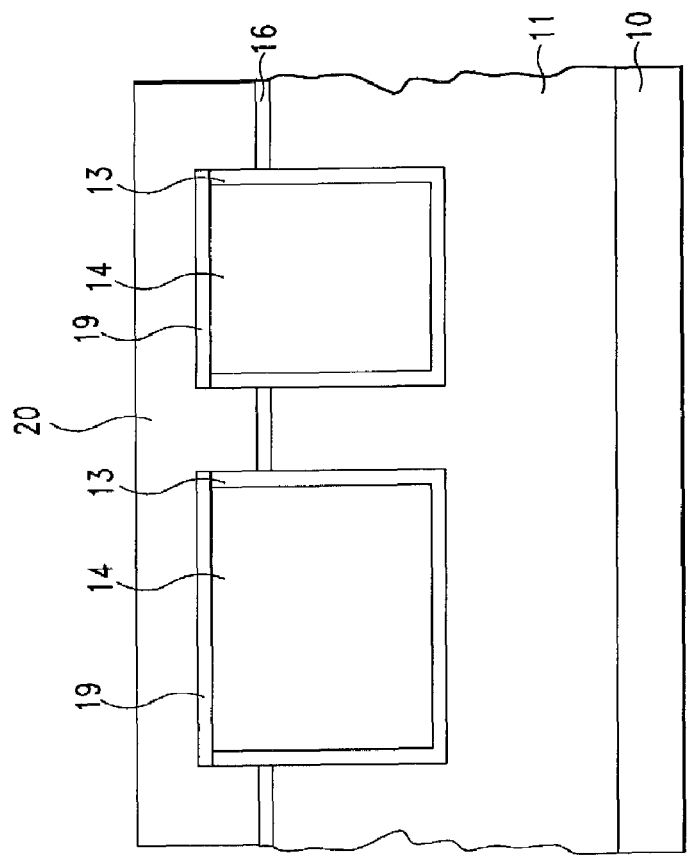

In one embodiment of the present invention as shown in FIG. 8, this is followed by a conformal SiCNH cap 18, which is preferably a PECVD capping process. FIG. 9 shows another embodiment of the present invention where the selective etch back of FIG. 7 is followed by selective CoWP cap 19, which is preferably an electroless plated capping process. This is a preferred embodiment since it will add less additional capacitance.

Figure 10:
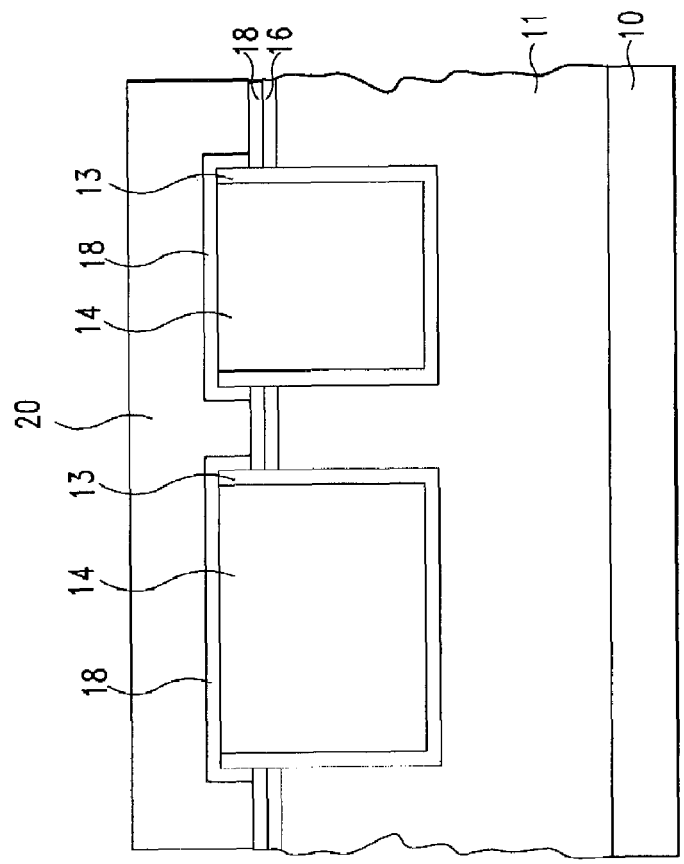

Either option is followed by the deposition of a second dielectric layer 20 for the next interconnect level as shown in FIG. 10 for the conformal SiCNH embodiment and FIG. 111 for the selective CoWP embodiment.

It will be apparent to those skilled in the art having regard to this disclosure that other modifications of this invention beyond those embodiments specifically described here may be made without departing from the spirit of the invention as limited solely by the appended claims.

What is claimed is:

1. An electronic device, comprising:
a first diffusion barrier layer;
a first dielectric layer on said fist diffusion barrier layer;
a hardmask layer on portions of said first dielectric layer;
a liner layer on portions of said first dielectric layer, wherein said liner layer is not in contact with said first diffusion barrier layer;
a metal layer on said liner layer, said metal layer protruding above the plane formed by said first dielectric layer and said hardmask layer;
a second diffusion barrier layer contiguous with said hardmask layer and said metal layer, and
a second dielectric layer on said second diffusion barrier layer.

2. The electronic device of claim 1 wherein said second diffusion barrier layer is an SiCNH layer.

3. The electronic device of claim 1 wherein said hardmask layer is SiCOH.

4. The electronic device of claim 1 wherein said first and second dielectric layers are ULK dielectrics.

5. The electronic device of claim 1 wherein said metal layer is a copper layer.

* * * * *